United States Patent
Haehn et al.

(10) Patent No.: US 7,617,427 B2
(45) Date of Patent: Nov. 10, 2009

(54) METHOD AND APPARATUS FOR DETECTING DEFECTS IN INTEGRATED CIRCUIT DIE FROM STIMULATION OF STATISTICAL OUTLIER SIGNATURES

(75) Inventors: Steven L. Haehn, Ft. Collins, CO (US); Robert B. Benware, Clackamas, OR (US)

(73) Assignee: LSI Corporation, Milpitas, CA (US)

( * ) Notice: Subject to any disclaimer, the term of this patent is extended or adjusted under 35 U.S.C. 154(b) by 439 days.

(21) Appl. No.: 11/324,084

(22) Filed: Dec. 29, 2005

(65) Prior Publication Data

US 2007/0157056 A1 Jul. 5, 2007

(51) Int. Cl.
G01R 31/28 (2006.01)

(52) U.S. Cl. .................................................... 714/724

(58) Field of Classification Search .................. 714/724, 714/732, 25, 30–33, 37–39, 47–48; 438/10, 438/14, 17; 324/76.11; 702/183, 108, 58
See application file for complete search history.

(56) References Cited

U.S. PATENT DOCUMENTS

| | | | |
|---|---|---|---|
| 5,291,426 A * | 3/1994 | Collins et al. ............. 702/195 |
| 6,184,048 B1 * | 2/2001 | Ramon ....................... 438/14 |
| 6,792,373 B2 * | 9/2004 | Tabor ........................ 702/108 |
| 7,167,811 B2 * | 1/2007 | Tabor ........................ 702/183 |
| 7,225,107 B2 * | 5/2007 | Buxton et al. ............. 702/183 |
| 7,356,430 B2 * | 4/2008 | Miguelanez et al. ....... 702/108 |
| 7,395,170 B2 * | 7/2008 | Scott et al. ................. 702/118 |
| 2003/0014205 A1 * | 1/2003 | Tabor ........................ 702/84 |
| 2005/0114061 A1 * | 5/2005 | Gauthier et al. ............ 702/99 |
| 2007/0157056 A1 * | 7/2007 | Haehn et al. ............... 714/724 |

* cited by examiner

Primary Examiner—Phung M Chung
(74) Attorney, Agent, or Firm—Ryan, Mason & Lewis, LLP

(57) ABSTRACT

A method and computer program for detecting and locating defects in integrated circuit die from stimulation of statistical outlier signatures includes receiving as input a test value of an electrical parameter measured for each of a plurality of identically designed electrical circuits, identifying one of the identically designed electrical circuits as an outlier for which the test value of the electrical parameter varies from a mean test value of the electrical parameter for the plurality of identically designed electrical circuits by at least a selected difference, monitoring the test value while subjecting a location on the outlier to a stimulus to detect a change in the test value as a function of the location, and generating as output the location for which the change in the test value is detected to identify a defect in the outlier.

21 Claims, 6 Drawing Sheets

METHOD AND APPARATUS FOR DETECTING DEFECTS IN INTEGRATED CIRCUIT DIE FROM STIMULATION OF STATISTICAL OUTLIER SIGNATURES

BACKGROUND OF THE INVENTION

1. Field of the Invention

The present invention is directed to the design and manufacture of integrated circuits. More specifically, but without limitation thereto, the present invention is directed to a method of detecting and locating defects in integrated circuit die.

2. Description of Related Art

In product engineering and failure analysis of integrated circuits, the reliability and yield of a production lot of identically designed integrated circuits is highly dependent on process variations during manufacture such as temperature and uniformity of wafer thickness. Several methods have been developed to detect and locate defects in integrated circuit die from tests that reveal performance failures.

SUMMARY OF THE INVENTION

In one embodiment, a method of detecting and locating defects in integrated circuit die from stimulation of statistical outlier signatures includes steps of:
- (a) receiving as input a test value of an electrical parameter measured for each of a plurality of identically designed electrical circuits;
- (b) identifying one of the identically designed electrical circuits as an outlier for which the test value of the electrical parameter varies from a mean test value of the electrical parameter for the plurality of identically designed electrical circuits by at least a selected difference;
- (c) monitoring the test value while subjecting a location on the outlier to a stimulus to detect a change in the test value as a function of the location; and
- (d) generating as output the location for which the change in the test value is detected to identify a defect in the outlier.

In another embodiment, a computer program product includes:
- a medium for embodying a computer program for input to a computer; and
- a computer program embodied in the medium for causing the computer to perform steps of:
  - (a) receiving as input a test value of an electrical parameter measured for each of a plurality of identically designed electrical circuits;
  - (b) identifying one of the identically designed electrical circuits as an outlier for which the test value of the electrical parameter varies from a mean test value of the electrical parameter for the plurality of identically designed electrical circuits by at least a selected difference;
  - (c) monitoring the test value while subjecting a location on the outlier to a stimulus to detect a change in the test value as a function of the location; and
  - (d) generating as output the location for which the change in the test value is detected to identify a defect in the outlier.

BRIEF DESCRIPTION OF THE DRAWINGS

The above and other aspects, features and advantages will become more apparent from the description in conjunction with the following drawings presented by way of example and not limitation, wherein like references indicate similar elements throughout the several views of the drawings, and wherein.

Figure 1:
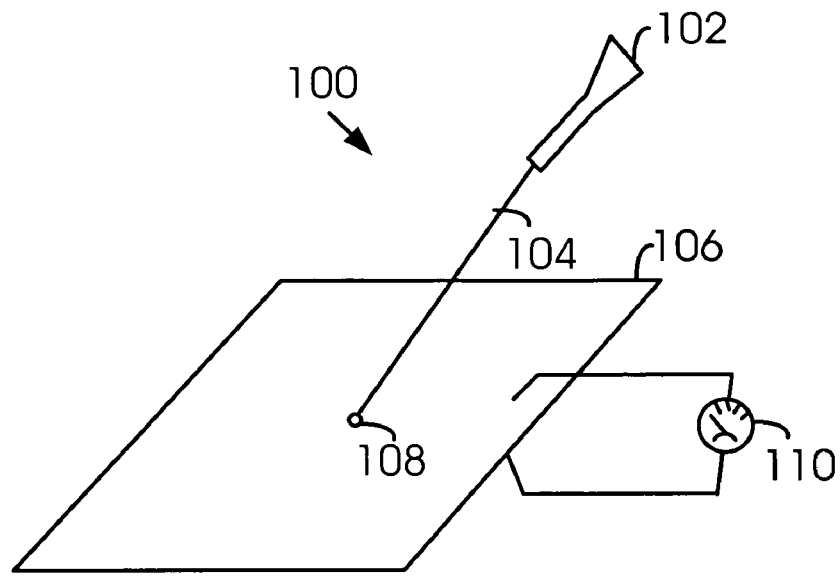
FIG. 1 illustrates a diagram of an external stimulation configuration used to locate a defect in an integrated circuit die according to the prior art.

Elements in the figures are illustrated for simplicity and clarity and have not necessarily been drawn to scale. For example, the dimensions, sizing, and/or relative placement of some of the elements in the figures may be exaggerated relative to other elements to clarify distinctive features of the illustrated embodiments. Also, common but well-understood elements that may be useful or necessary in a commercially feasible embodiment are often not depicted in order to facilitate a less obstructed view of the illustrated embodiments.

DESCRIPTION OF THE ILLUSTRATED EMBODIMENTS

The following description is not to be taken in a limiting sense, rather for the purpose of describing by specific examples the general principles that are incorporated into the illustrated embodiments. For example, certain actions or steps may be described or depicted in a specific order to be performed. However, practitioners of the art will understand that the specific order is only given by way of example and that the specific order does not exclude performing the described steps in another order to achieve substantially the same result. Also, the terms and expressions used in the description have the ordinary meanings accorded to such terms and expressions in the corresponding respective areas of inquiry and study except where other meanings have been specifically set forth herein.

Integrated circuits (ICs) are susceptible to manufacturing defects that may cause an integrated circuit to malfunction, called faults. Two important categories of fault models in integrated circuits are single stuck-at faults (SAF) and transition delay faults (TDF). Stuck-at faults occur when a signal designed to transition between two logic states (0 and 1) remains in one state due to a manufacturing defect. A transition delay fault occurs when a signal transitions too late or too slow for proper operation due to, for example, excessive net capacitance. Stuck-at faults may be detected by applying a single test pattern to each register of an integrated circuit, while transition delay faults require two test patterns.

To determine whether an integrated circuit die has a fault, the die is typically tested using automated test equipment (ATE) to detect and reject defective die before shipment to a customer. The test output vectors generated by a die under test in response to a set of test input vectors devised by the manufacturer are compared to a set of predetermined target vectors. If the test output vectors match the target vectors, then the die passes, otherwise the die fails. The number of faults that may be detected by automated test equipment is typically expressed as a percentage of the total number of possible faults and is called the fault coverage of the test. A high value of fault coverage is desirable to avoid the costs associated with delivering defective parts. Automated test equipment that provides high fault coverage may be prohibitively expensive for complex integrated circuits, and techniques for detecting transition delay faults in complex integrated circuits may incur unacceptable delays in turnaround time.

When a fault is detected in an integrated circuit die, it is desirable to find the location of the fault in the integrated circuit so that the cause of the defect may be corrected. Integrated circuit die that fail one or more of the test vectors typically exhibit an operating current (IDD) that is elevated from its nominal value for one or more specific test vectors. In one failure analysis technique used to locate faults, called "current chasing", a beam of electrons is scanned across the die to cause the elevated operating current to change when the beam is scanned over the defect.

FIG. 1 illustrates a diagram 100 of an external stimulation configuration used to locate a defect in an integrated circuit die according to the prior art. Shown in FIG. 1 are a beam source 102, a stimulating beam 104, an integrated circuit die 106, a beam location 108, and a measuring device 110.

In FIG. 1, the beam source 102 generates the stimulating beam 104. The stimulating beam 104 may be, for example, a beam of electrons, ions, or photons focused on the beam location 108 on the integrated circuit die 106. In another embodiment, the stimulating beam 104 may be a thermal probe. Preferably, the beam location 108 is confined to an area that may be magnified to a convenient scale for visual inspection of a physical defect in the integrated circuit die 106. The beam source 102 typically includes a scanning mechanism for raster scanning the stimulating beam 104 across the integrated circuit die 106.

Alternatively, the beam source 102 may include a mechanism for reducing the area of the stimulating beam 104 from an area that covers the entire integrated circuit die 106 to successively smaller areas using a binary search. The search continues in successively smaller areas of the integrated circuit die 106 until the area exposed to the stimulating beam 104 reaches a size that may be magnified to a convenient scale for visual inspection of a physical defect in the integrated circuit die 106.

In a typical method of current chasing, the measuring device 110 monitors the operating current of the integrated circuit die 106 while the stimulating beam 104 is scanned over the integrated circuit die 106. When the measuring device 110 detects a change in the operating current, the coordinates of the beam location 108 at which the change in operating current occurs are generated as output. A magnified image of the integrated circuit die 106 is generated at the coordinates of the beam location 108 at which the change in operating current occurs for visual inspection of the defect. Examples of current chasing include light induced voltage alteration (LIVA), charge induced voltage alteration (CIVA), and thermal induced voltage alteration (TIVA). An example of a similar technique that may be applied to devices that do not draw electrical current is optical beam induced resistance change (OBIRCH). In optical beam induced resistance change, the stimulating beam 104 is a beam of photons used to vary the electrical resistance of a location in the integrated circuit die 106.

In areas of integrated circuit product engineering and failure analysis, outlier screening techniques are used to detect abnormal deviations or statistical anomalies of an electrical parameter in a production lot of identically designed integrated circuits that do not necessarily fail during fault testing. For example, quiescent current (IDDQ) is an electrical parameter that may be measured for each of the integrated circuits in the production lot. The measured values of the quiescent current have a mean and a standard deviation that are representative of the manufacturing technology and the process variations that occur during manufacturing.

Figure 2:
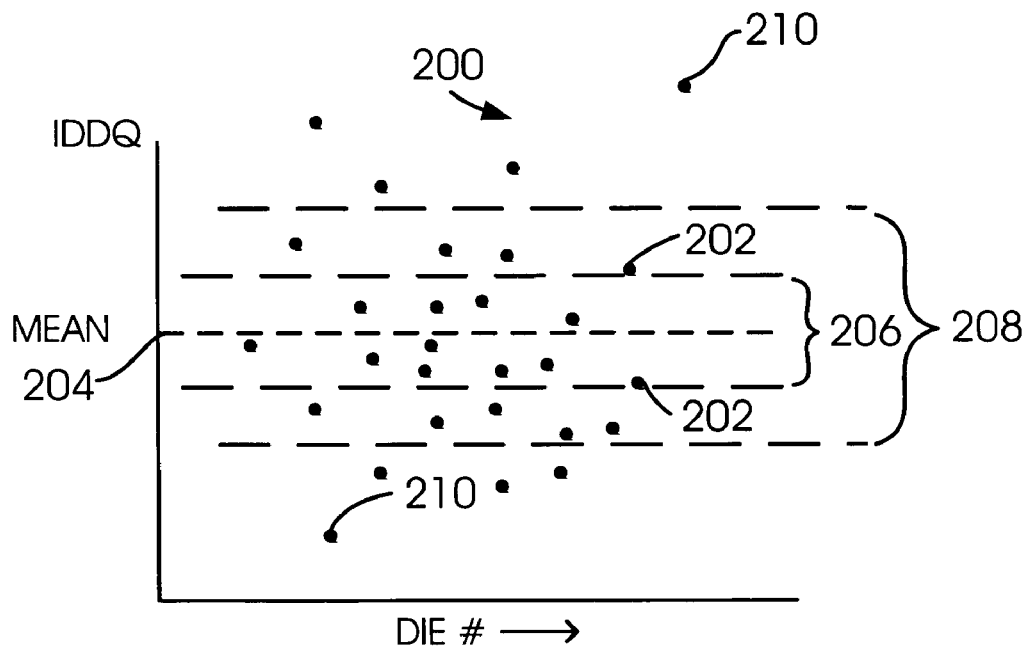
FIG. 2 illustrates a scatter plot of measured quiescent current values vs. die number for a sample lot of integrated circuit die according to the prior art.

FIG. 2 illustrates a scatter plot 200 of measured quiescent current values vs. die number for a sample lot of integrated circuit die according to the prior art. Shown in FIG. 2 are measured values 202, a mean value 204, a standard deviation 206, a selected multiple of a standard deviation 208, and outlier signatures 210.

It has been found that integrated circuit die having a measured value of quiescent current that lies outside the mean value 204 by more than a selected multiple of the standard deviation 206, for example, two or three times the standard deviation 206, typically fail during operation even though the same die may pass tests for stuck-at faults and transition delay faults that are designed to screen defective parts. Integrated circuit die having a measured value of quiescent current that lies outside the mean value 204 by more than the selected multiple of the standard deviation 208 are called statistical outliers, or simply outliers. The outlier signatures 210 are a measure of the difference between the test value of quiescent current measured for each outlier and the mean value of the test value for all of the integrated circuit die in the sample lot. Outlier screening techniques are typically used to screen defective parts that do not necessarily fail during ATE testing to provide increased fault coverage. Outlier screening techniques are effective in screening defective parts; however, they do not provide information about the location of the defect that causes the statistical anomaly in the quiescent current.

A method that both detects and locates a defect in an integrated circuit die from an outlier signature is described below that leverages both the outlier screening techniques and the current chasing techniques described above to detect and locate a defect in an integrated circuit die.

While the examples described below are specifically directed to failure analysis of integrated circuit die, other electrical circuits than integrated circuits may be used and other purposes than failure analysis may be served to practice various embodiments within the scope of the appended claims.

In one embodiment, a method of detecting and locating defects in integrated circuit die from stimulation of statistical outlier signatures includes steps of:

(a) receiving as input a test value of an electrical parameter measured for each of a plurality of identically designed electrical circuits;

(b) identifying one of the identically designed electrical circuits as an outlier for which the test value of the electrical parameter varies from a mean test value of the electrical parameter for the plurality of identically designed electrical circuits by at least a selected difference;

(c) monitoring the test value while subjecting a location on the outlier to a stimulus to detect a change in the test value as a function of the location; and (d) generating as output the location for which the change in the test value is detected to identify a defect in the outlier.

Although the technique of current chasing in the presence of a physical stimulus described above with reference to FIG. 1 is well known for locating a defect in a die that fails a one or more test vectors during testing, it has not been applied to the problem of identifying locations that are likely to result in a malfunction of a die that does not fail during testing.

Figure 3:
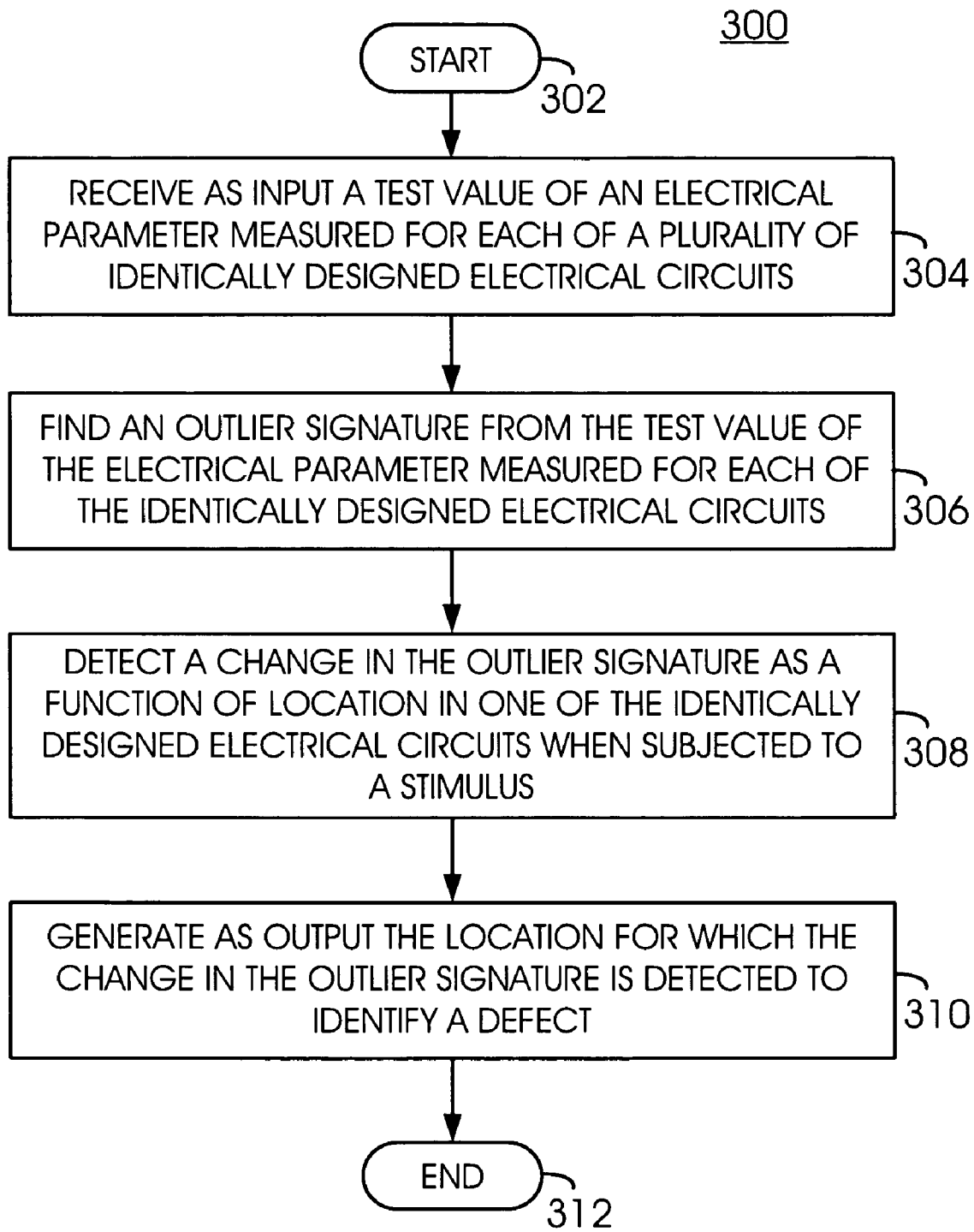
FIG. 3 illustrates a flow chart for a method of detecting and locating defects in integrated circuit die from stimulation of statistical outlier signatures.

FIG. 3 illustrates a flow chart 300 for a method of detecting and locating defects in integrated circuit die from stimulation of statistical outlier signatures.

Step 302 is the entry point of the flow chart 300.

In step 304, a test value of an electrical parameter measured for each of a plurality of identically designed electrical circuits is received as input. Examples of an electrical parameter used to identify statistical outliers are static quiescent current (IDDQ) as a function of a test input vector, operating current (IDD) as a function of a test input vector, minimum operating voltage (VDD min) as a function of a test input vector, clock cycle, or operating frequency, and maximum operating voltage (VDD max) as a function of a test input vector, clock period, or operating frequency.

In contrast to the current chasing techniques described above with reference to FIG. 1, the electrical parameter used to identify statistical outliers does not require a change in supply current. In other embodiments, other electrical parameters may be used. Test values of the electrical parameter are measured for each electrical circuit according to well-known techniques. In one embodiment, the identically designed electrical circuits constitute a sample lot of integrated circuit die.

In step 306, an outlier signature is found from the test value of the electrical parameter measured for each of the identically designed electrical circuits. In one embodiment, the electrical parameter measured for each electrical circuit is minimum operating voltage. The minimum operating voltage may be found, using a reduced test vector set, for example, 500 test vectors, and applying a low operating voltage to the die. The operating voltage is gradually increased to a point where all the die in the sample lot pass the reduced test vector set.

A normal variation in the minimum operating voltage results from process variations in the manufacturing process. A guard band may be added to the operating voltage, for example, 10 percent of the operating voltage found for the 500 test vectors, to compensate for the normal variation. The minimum operating voltage is the sum of the operating voltage plus the guard band. The minimum operating voltage is then used to drive each of the die with the remaining vectors in the test set, for example, 9,500 vectors. Typically, only a small percentage of the die will not pass. The die that do not pass are identified as outliers, and the outlier signature is the difference between the minimum operating voltage and the operating voltage required for the outlier to pass the remaining vectors in the test set. However, the die may well pass all of the test vectors at the absolute minimum operating voltage specified by the manufacturer. The goal in outlier screening is to identify circuits that differ statistically from other identically designed circuits, because these circuits typically fail under conditions rarely found during testing or even in use under most operating conditions. In other embodiments, outliers may be identified from a variety of well-known measurement techniques within the scope of the appended claims.

In general, the test value of an electrical parameter measured for one of a plurality of identically designed circuits that differs from the test values measured for the other identically designed circuits by a statistically significant amount, such as a selected multiple of a standard deviation, is sufficient to identify an outlier. However, other criteria may be used to find outlier signatures according to well-known outlier screening techniques to practice various embodiments within the scope of the appended claims.

An outlier signature differs from a typical failure analysis signature, for example, in that an outlier signature is representative of a value measured for an electrical parameter that differs from the value measured for other identically designed die by a statistically significant amount, while a typical failure analysis signature is representative of a test output vector that does not match a design reference output vector. Further, an outlier signature does not depend on a functional fault, therefore an outlier signature may be found in a die that has no stuck-at faults or transition delay faults that may be detected by applying a test block of input vectors to the die and comparing the output to a reference vector.

In step 308, the outlier test value is monitored to detect a change as a function of location in one of the identically designed electrical circuits when subjected to a stimulus, for example, using the current chasing apparatus described above with regard to FIG. 1. The change in the outlier test value may be detected, for example, by scanning a laser beam, an electron beam, a photon beam, or other form of radiation across each location on a die.

In another embodiment, the beam area is varied to expose successively smaller areas on the die, for example, in a binary search. In an exemplary binary search, the initial beam area equal is to the area of the die. When a change in the outlier test value is detected, the beam area is halved. The area associated with the change in the outlier test value is exposed to the smaller beam, and the area half associated with the change in the outlier test value is selected. The beam area is halved again, and the procedure repeats until the beam size reaches a selected limit that isolates the location to an area that may be conveniently viewed under magnification to find a defect in the die that results in the outlier signature.

In step 310, the location for which the change in the outlier signature is detected is generated as output to identify a defect.

Step 312 is the exit point of the flow chart 300.

Figure 4:
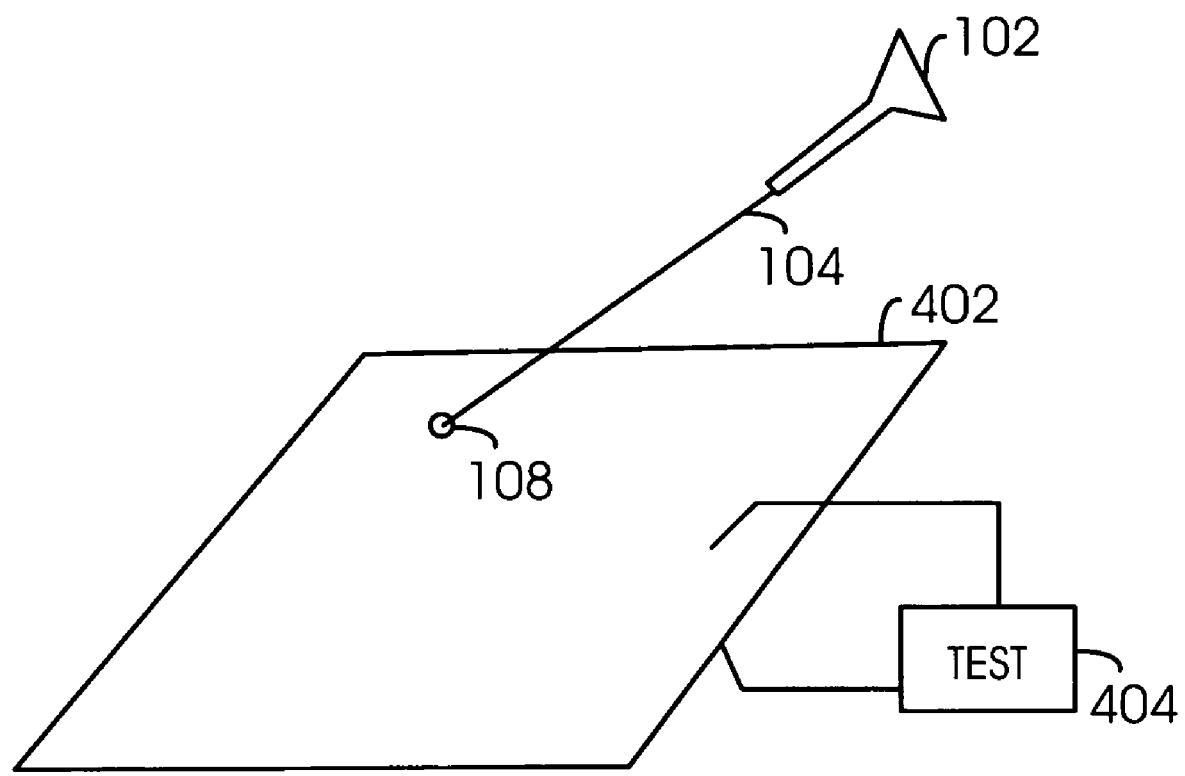
FIG. 4 illustrates a diagram of a configuration for detecting and locating a defect in an integrated circuit die from a statistical outlier signature using the method of FIG. 3.

FIG. 4 illustrates a diagram of a configuration 400 for detecting and locating a defect in an integrated circuit die from a statistical outlier signature using the method of FIG. 3. Shown in FIG. 4 are a beam source 102, a stimulating beam 104, a beam location 108, an integrated circuit die 402, and a measuring apparatus 404.

In FIG. 4, the beam source 102, the stimulating beam 104, and the beam location 108 may be the same as described above with reference to FIG. 1 to provide the stimulus to which the integrated circuit die 402 is subjected. The integrated circuit die 402 is one of a sample lot of identical integrated circuit die that has been identified as an outlier, for example, according to one of the methods described above with reference to FIG. 2.

The measuring apparatus 404 that monitors the electrical parameter may be, for example, the same apparatus used to measure the electrical parameter to identify the integrated circuit die 402 as an outlier. The electrical parameter measured to identify an outlier does not include test vectors and does not include the operating current IDD or power consumption of only the device under test used in the current chasing techniques described with reference to FIG. 1. However, test vectors may be used in conjunction with the electrical parameter to identify outliers and to generate outlier signatures. The measurements of the electrical parameter from the integrated circuit die 402 by the measuring apparatus 404 may be used to generate the plots in FIGS. 5 and 6 as follows.

Figure 5A:
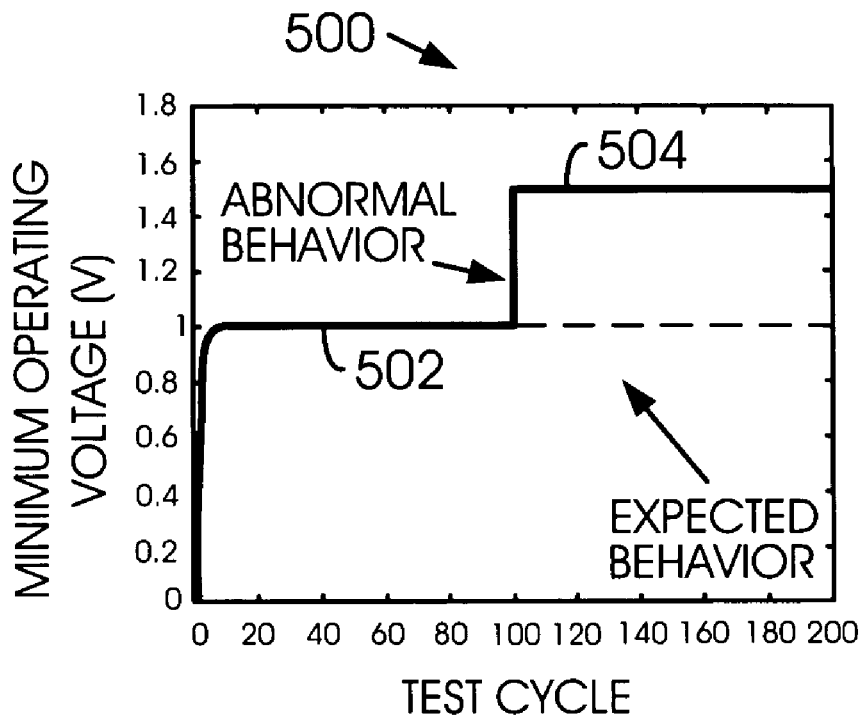
FIG. 5A illustrates a plot of minimum operating voltage as a function of test cycle number for the integrated circuit die of FIG. 4.

FIG. 5A illustrates a plot 500 of minimum operating voltage as a function of test cycle number for the integrated circuit die of FIG. 4. Shown in FIG. 5A are a nominal test value 502 and an abnormal test value 504.

In FIG. 5A, a new test vector is added to the test vector set from a test block in each test cycle. The minimum operating voltage remains at the nominal test value 502 until test cycle 100. The nominal test value is a test value that lies within a selected range of the mean test value for the sample lot of integrated circuit die, for example, one standard deviation.

In test cycle 100, a test vector is added that results in the abnormal test value 504 responsible for the outlier signature. Each subsequent test cycle includes the test vector that was added at test cycle 100, resulting in the continued abnormal test value 504 for the remaining test cycles. There may also be additional test vectors in the test block that produce the abnormal test value 504. The outlier signature may be generated by repeating one or more of the test cycles that cause the integrated circuit die to exhibit the abnormal test value 504.

Figure 5B:
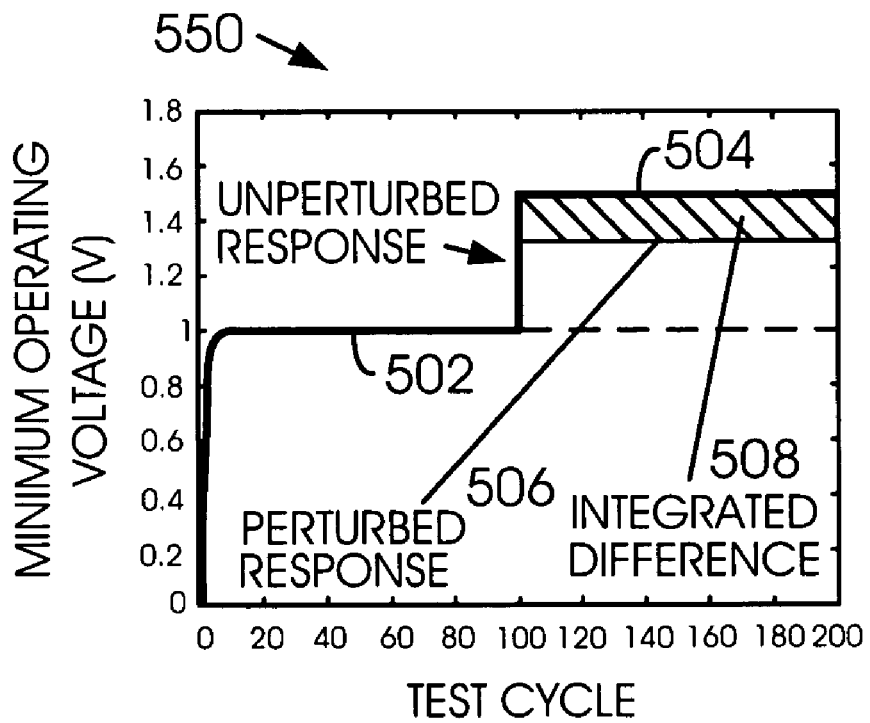
FIG. 5B illustrates a plot of minimum operating voltage as a function of test cycle number for the integrated circuit die of FIG. 4 when the outlier is exposed to a stimulus.

FIG. 5B illustrates a plot 550 of minimum operating voltage as a function of test cycle number for the integrated circuit die of FIG. 4 when the outlier is exposed to a stimulus. Shown in FIG. 5B are a nominal test value 502, an abnormal test value 504, a perturbed test value 506, and an integrated difference 508.

In FIG. 5B, the outlier signature is produced by applying the appropriate test condition to generate the abnormal test value 504. The outlier is then exposed to a stimulus, for example, the same manner as described with reference to FIG. 1. When a certain location on the outlier is exposed to the stimulus, the abnormal test value 504 changes to the perturbed test value 506. The difference between the abnormal test value 504 and the perturbed test value 506 is then integrated over the test cycles that result in the perturbed test value 506, generating the integrated difference 508.

Figure 6:
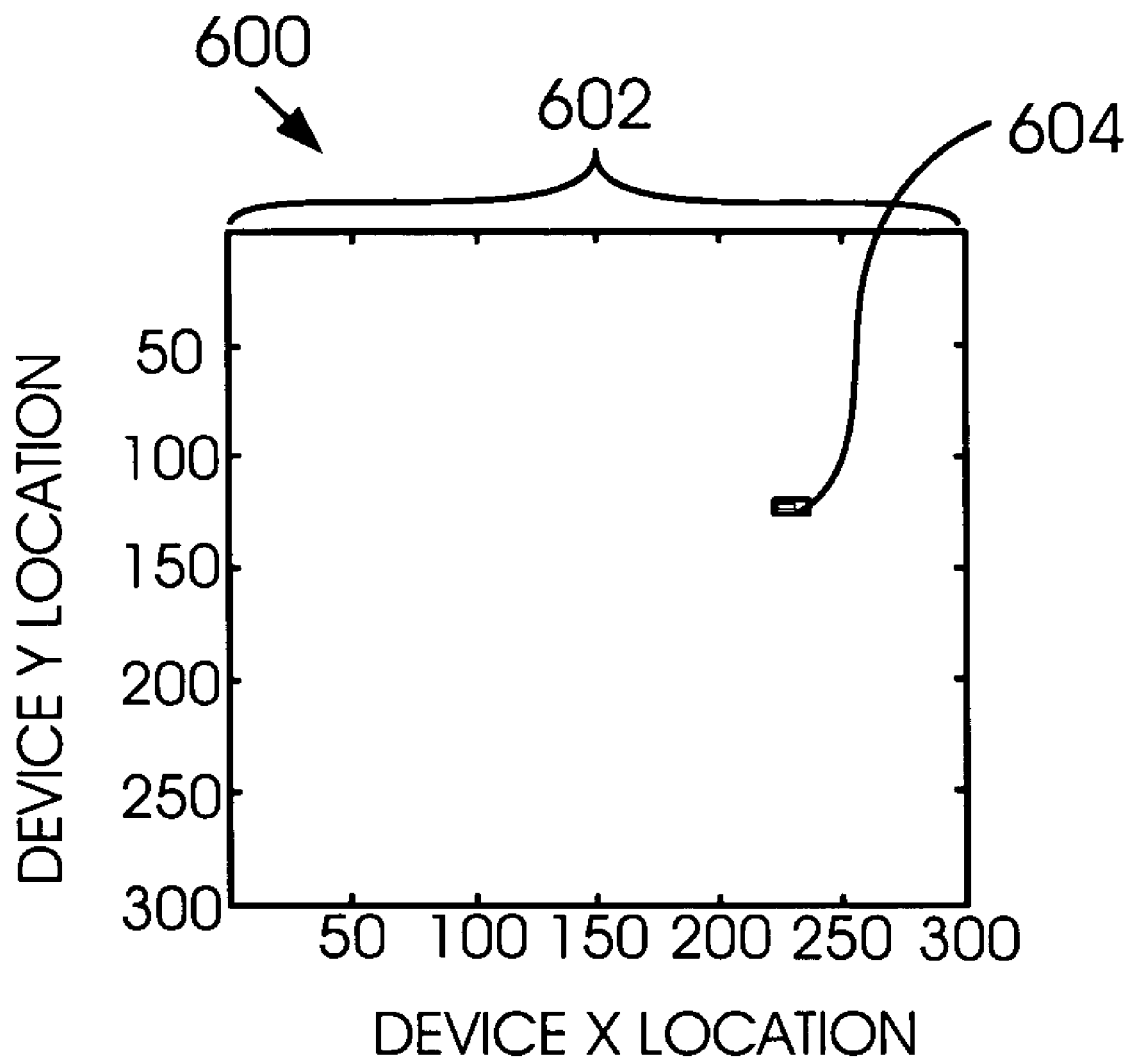
FIG. 6 illustrates an X-Y plot of an outlier signature as a function of location on the integrated circuit die of FIG. 4.

FIG. 6 illustrates an X-Y plot 600 of an outlier signature as a function of location on the integrated circuit die of FIG. 4. Shown in FIG. 6 are die locations 602 and an anomaly location 604.

In FIG. 6, each of the die locations 602 is subjected to a stimulus as described with reference to FIG. 4 while the integrated circuit die 402 is exhibiting the outlier signature. Each of the die locations 602 represents, for example, an integrated circuit die in a production lot of identically designed integrated circuits. In most of the die locations 602, no change in the test value exhibiting the outlier signature is detected by the test measurement and monitoring apparatus 404 in FIG. 4. However, when the anomaly location 604 is exposed to the stimulus 104 from the beam source apparatus 102 in FIG. 4, the test value changes to the perturbed test value. The change is shown on the plot 600, for example, as a pixel having a color or intensity corresponding to the integrated difference between the abnormal test value and the perturbed test value. There may be more than one anomaly location among the die locations 602. For example, a defect in a metal trace may appear as a pattern of anomaly locations that duplicates the trace route in the integrated circuit die 402.

Once the location of the anomaly is known, a magnified view of the location may be generated according to well-known micro-photographic techniques and viewed by a design engineer to determine the defect that causes the anomaly location 604.

The flow chart described in FIG. 3 may also be automated by instructions for a computer. The instructions may be embodied in a disk, a CD-ROM, and other computer readable media according to well known computer programming techniques.

In another embodiment, a computer program product includes:

a medium for embodying a computer program for input to a computer; and a computer program embodied in the medium for causing the computer to perform steps of:

(a) receiving as input a test value of an electrical parameter measured for each of a plurality of identically designed electrical circuits;

(b) identifying one of the identically designed electrical circuits as an outlier for which the test value of the electrical parameter varies from a mean test value of the electrical parameter for the plurality of identically designed electrical circuits by at least a selected difference;

(c) monitoring the test value while subjecting a location on the outlier to a stimulus to detect a change in the test value as a function of the location; and (d) generating as output the location for which the change in the test value is detected to identify a defect in the outlier.

Figure 7:
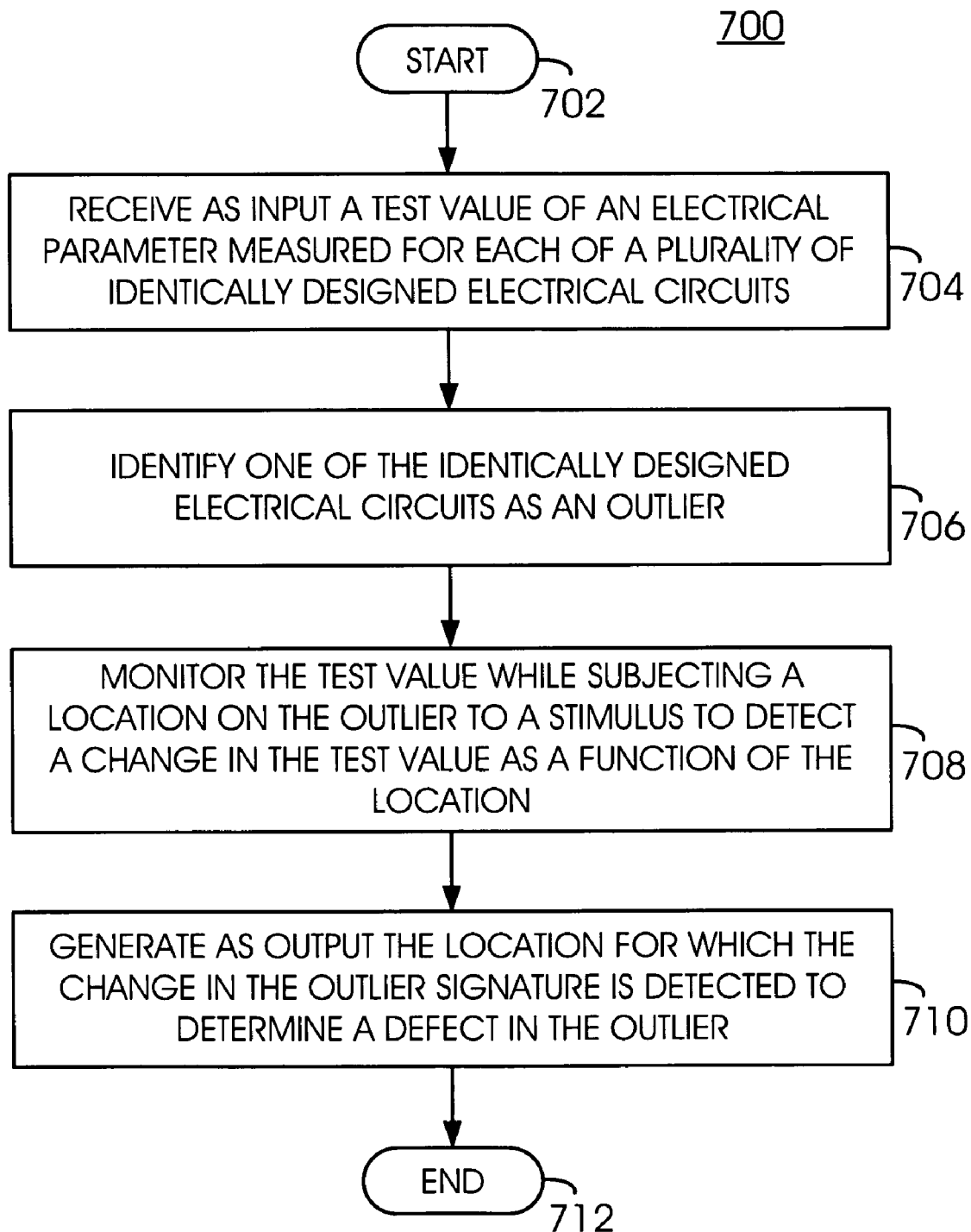
FIG. 7 illustrates a flow chart for a computer program product for detecting and locating defects in integrated circuit die from stimulation of statistical outlier signatures that summarizes the method of FIG. 3.

FIG. 7 illustrates a flow chart for a computer program product for detecting and locating defects in integrated circuit die from stimulation of statistical outlier signatures that summarizes the method of FIG. 3.

Step 702 is the entry point of the flow chart 500.

In step 704, a test value of an electrical parameter measured for each of a plurality of identically designed electrical circuits is received as input.

In step 706, one of the identically designed electrical circuits is identified as an outlier for which the test value of the electrical parameter varies from a mean test value of the electrical parameter for the plurality of identically designed electrical circuits by at least a selected difference.

In step 708, the test value is monitored while subjecting a location on the outlier to a stimulus to detect a change in the test value as a function of the location.

In step 710, the location for which the change in the test value is detected is generated as output to determine a defect in the outlier.

Step 712 is the exit point of the flow chart 700.

In contrast to failure analysis methods that assume that a defect has already been detected in an integrated circuit die, the method described above may advantageously be used to detect and locate a defect in a die without the prerequisite of a failed test pattern.

Although the flowchart descriptions above are described and shown with reference to specific steps performed in a specific order, these steps may be combined, sub-divided, or reordered without departing from the scope of the claims. Unless specifically indicated, the order and grouping of steps is not a limitation of other embodiments that may lie within the scope of the claims.

The specific embodiments and applications thereof described above are for illustrative purposes only and do not preclude modifications and variations that may be made within the scope of the following claims.

What is claimed is:

1. A method comprising steps of:
   (a) receiving as input a test value of an electrical parameter measured for each of a plurality of identically designed electrical circuits;
   (b) identifying one of the identically designed electrical circuits as an outlier for which the test value of the electrical parameter varies from a mean test value of the electrical parameter for the plurality of identically designed electrical circuits by at least a selected difference;
   (c) monitoring the test value while subjecting a location on the outlier to a stimulus to detect a change in the test value as a function of the location; and
   (d) generating as output the location for which the change in the test value is detected to identify a defect in the outlier;
   wherein each of steps (a), (b), (c) and (d) is performed by one or more computers.

2. The method of claim 1 wherein step (c) comprises subjecting the outlier to a beam of at least one of optical radiation, thermal radiation, and charged particles.

3. The method of claim 1 wherein step (a) comprises measuring an electrical parameter comprising at least one of minimum operating voltage, maximum operating voltage, minimum operating frequency, maximum operating frequency, static leakage current, and dynamic leakage current.

4. The method of claim 3 comprising measuring the electrical parameter as a function of at least one of a test vector, a clock cycle, a supply voltage, and a device logic state.

5. The method of claim 1 comprising calculating the selected difference as a multiple of a standard deviation of the electrical parameter for the plurality of identically designed electrical circuits.

6. The method of claim 1 wherein step (c) comprises applying the stimulus to one of a plurality of scanned coordinates on the outlier.

7. The method of claim 1 wherein step (c) comprises applying the stimulus to successively smaller areas on the outlier.

8. The method of claim 1 wherein step (a) comprises measuring the electrical parameter for each of a plurality of identically designed electrical circuits having no stuck-at faults.

9. The method of claim 1 wherein step (a) comprises measuring the electrical parameter for each of a plurality of identically designed electrical circuits having no transition delay faults.

10. The method of claim 1 wherein step (a) comprises measuring a test value of an electrical parameter that does not include operating current.

11. A computer program product comprising: a computer usable storage medium having computer usable program code embodied therewith, the computer usable program code configured for causing a computer to perform steps of:
    (a) receiving as input a test value of an electrical parameter measured for each of a plurality of identically designed electrical circuits;
    (b) identifying one of the identically designed electrical circuits as an outlier for which the test value of the electrical parameter varies from a mean test value of the electrical parameter for the plurality of identically designed electrical circuits by at least a selected difference;
    (c) monitoring the test value while subjecting a location on the outlier to a stimulus to detect a change in the test value as a function of the location; and
    (d) generating as output the location for which the change in the test value is detected to identify a defect in the outlier;
    such that each of steps (a), (b), (c) and (d) is performed by the computer.

12. The computer program product of claim 11 wherein step (c) comprises subjecting the outlier to a beam of at least one of optical radiation, thermal radiation, and charged particles.

13. The computer program product of claim 11 wherein step (a) comprises measuring an electrical parameter comprising at least one of minimum operating voltage, maximum operating voltage, minimum operating frequency, maximum operating frequency, static leakage current, and dynamic leakage current.

14. The computer program product of claim 13 comprising measuring the electrical parameter as a function of at least one of a test vector, a clock cycle, a supply voltage, and a device logic state.

15. The computer program product of claim 11 comprising calculating the selected difference as a multiple of a standard deviation of the electrical parameter for the plurality of identically designed electrical circuits.

16. The computer program product of claim 11 wherein step (c) comprises applying the stimulus to one of a plurality of scanned coordinates on the outlier.

17. The computer program product of claim 11 wherein step (c) comprises applying the stimulus to successively smaller areas on the outlier.

18. The computer program product of claim 11 wherein step (a) comprises measuring the electrical parameter for each of a plurality of identically designed electrical circuits having no stuck-at faults.

19. The computer program product of claim 11 wherein step (a) comprises measuring the electrical parameter for each of a plurality of identically designed electrical circuits having no transition delay faults.

20. The computer program product of claim 11 wherein step (a) comprises measuring a test value of an electrical parameter that does not include operating current.

21. An apparatus comprising:
    a measuring apparatus for measuring a test value of an electrical parameter for each of a plurality of identically designed electrical circuits to identify an outlier;
    an apparatus for subjecting the outlier to a stimulus; and
    a monitoring device for monitoring the test value while subjecting a location on the outlier to the stimulus to detect a change in the test value as a function of the location.

* * * * *